(12) United States Patent
Wu et al.

(10) Patent No.: US 9,728,646 B2
(45) Date of Patent: Aug. 8, 2017

(54) FLAT STI SURFACE FOR GATE OXIDE UNIFORMITY IN FIN FET DEVICES

(71) Applicant: TAIWAN SEMICONDUCTOR MANUFACTURING CO., LTD., Hsinchu (TW)

(72) Inventors: Cheng-Ta Wu, Chiayi County (TW); Shiu-Ko Jangjian, Hsinchu (TW); Cheng-Wei Chen, Tainan (TW); Ting-Chun Wang, Tainan (TW)

(73) Assignee: TAIWAN SEMICONDUCTOR MANUFACTURING CO., LTD., Taipei (TW)

( * ) Notice: Subject to any disclaimer, the term of this patent is extended or adjusted under 35 U.S.C. 154(b) by 0 days.

(21) Appl. No.: 14/925,846

(22) Filed: Oct. 28, 2015

(65) Prior Publication Data
US 2017/0062616 A1    Mar. 2, 2017

Related U.S. Application Data

(60) Provisional application No. 62/211,682, filed on Aug. 28, 2015.

(51) Int. Cl.
| | | |
|---|---|---|
| H01L 29/78 | (2006.01) | |
| H01L 29/06 | (2006.01) | |
| H01L 29/08 | (2006.01) | |
| H01L 29/16 | (2006.01) | |
| H01L 29/161 | (2006.01) | |
| H01L 29/165 | (2006.01) | |
| H01L 29/66 | (2006.01) | |

(52) U.S. Cl.
CPC ...... *H01L 29/7854* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/66795* (2013.01); *H01L 29/7848* (2013.01)

(58) Field of Classification Search
CPC .......... H01L 27/0886; H01L 27/10826; H01L 27/10876; H01L 29/66545
See application file for complete search history.

(56) References Cited

U.S. PATENT DOCUMENTS

| | | | | |
|---|---|---|---|---|
| 2009/0269916 A1* | 10/2009 | Kang | ................ | H01L 27/11568 438/587 |
| 2014/0319611 A1* | 10/2014 | Haran | ................... | H01L 21/845 257/347 |
| 2016/0086943 A1* | 3/2016 | Lee | ..................... | H01L 29/7848 257/401 |

* cited by examiner

*Primary Examiner* — Fernando L. Toledo
*Assistant Examiner* — Valerie N Newton
(74) *Attorney, Agent, or Firm* — McDermott Will & Emery LLP

(57) ABSTRACT

Operations in fabricating a Fin FET include providing a substrate having a fin structure, where an upper portion of the fin structure has a first fin surface profile. An isolation region is formed on the substrate and in contact with the fin structure. A portion of the isolation region is recessed by an etch process to form a recessed portion and to expose the upper portion of the fin structure, where the recessed portion has a first isolation surface profile. A thermal hydrogen treatment is applied to the fin structure and the recessed portion. A gate dielectric layer is formed with a substantially uniform thickness over the fin structure, where the recessed portion is adjusted from the first isolation surface profile to a second isolation surface profile and the fin structure is adjusted from the first fin surface profile to a second fin surface profile by the thermal hydrogen treatment.

19 Claims, 7 Drawing Sheets

FLAT STI SURFACE FOR GATE OXIDE UNIFORMITY IN FIN FET DEVICES

CROSS-REFERENCE TO RELATED APPLICATIONS

This application claims priority to U.S. Provisional Patent Application 62/211,682 filed Aug. 28, 2015, the subject matter of which is incorporated herein by reference in entirety.

BACKGROUND

With increasing down-scaling of integrated circuits and increasingly demanding requirements to speed of integrated circuits, transistors need to have higher drive currents with increasingly smaller dimensions. Fin Field-Effect Transistors (Fin FET) were thus developed. Fin FETs include vertical semiconductor fins above a substrate. The semiconductor fins are used to form source and drain regions, and channel regions between the source and drain regions. Shallow Trench Isolation (STI) regions are formed to define the semiconductor fins. The Fin FETs also include gate stacks, which are formed with sidewalls and over the top surfaces of the semiconductor fins.

BRIEF DESCRIPTION OF THE DRAWINGS

Aspects of the present disclosure are best understood from the following detailed description when read with the accompanying figures. It is to be understood that the following disclosure provides many different embodiments, or examples, for implementing different features of the present disclosure. Specific examples of components and arrangements are described below to simplify the present disclosure. These are, of course, merely examples and are not intended to be limiting. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
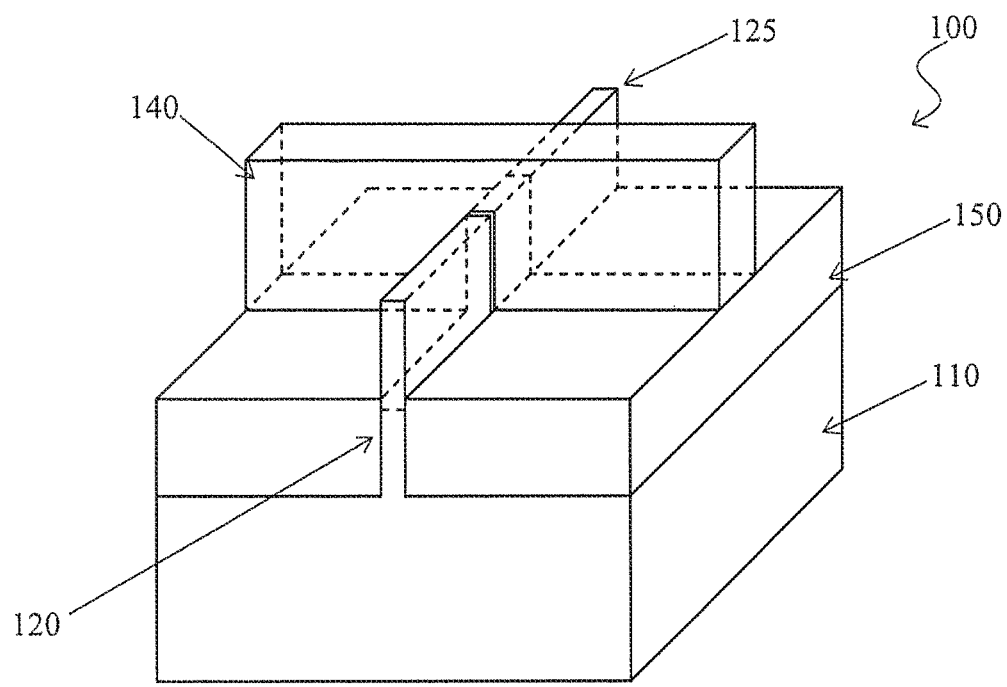
FIG. 1 is an exemplary perspective view of a Fin Field-Effect Transistor (Fin FET) device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 2A:
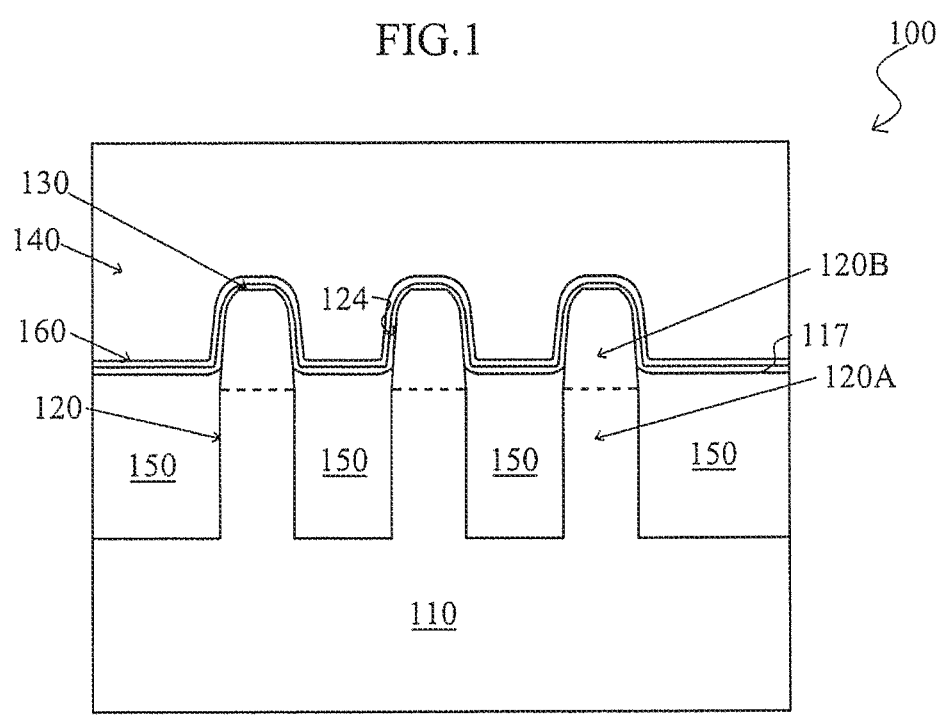
FIGS. 2A and 2B are exemplary cross sectional views of the Fin FET device having a fin structure along a gate electrode in accordance with some embodiments of the present disclosure.
Figure 2B:
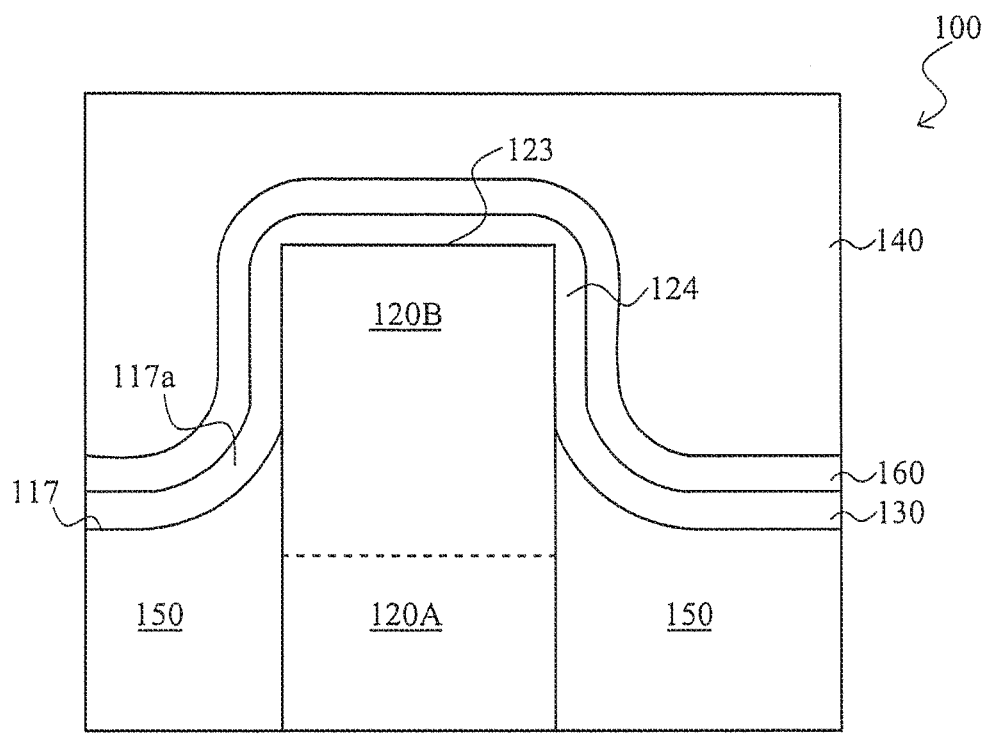

FIG. 1 is an exemplary perspective view of a Fin Field-Effect Transistor (Fin FET) device 100 having a fin structure according to one embodiment of the present disclosure, and FIG. 2A is an exemplary cross sectional view of the Fin FET device 100 having a fin structure along a gate electrode according to one embodiment of the present disclosure. In these figures, some layers/features are omitted for simplification. FIG. 2B is a detailed view of a single fin in FIG. 2A.

The Fin FET device 100 depicted in FIGS. 1, 2A, and 2B includes, among other features, a substrate 110, a fin structure 120, a gate dielectric layer 130 and a gate electrode layer 140. In this embodiment, the substrate 110 is a silicon substrate. Alternatively, the substrate 110 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 110 is a silicon layer of an SOI (silicon-on insulator) substrate. When an SOI substrate is used, the fin structure 120 may protrude from the silicon layer of the SOI substrate or may protrude from the insulator layer of the SOI substrate. In the latter case, the silicon layer of the SOI substrate is used to form the fin structure 120. Amorphous substrates, such as amorphous Si or amorphous SiC, or insulating material, such as silicon oxide may also be used as the substrate 110. The substrate 110 may include various regions that have been suitably doped with impurities (e.g., p-type or n-type conductivity).

The fin structure 120 is disposed over the substrate 110. The fin structure 120 may be made of the same material as the substrate 110 and may continuously extend from the substrate 110. In this embodiment, the fin structure 120 is made of silicon (Si). The silicon layer of the fin structure 120 may be intrinsic, or appropriately doped with an n-type impurity or a p-type impurity.

In FIG. 1, one fin structure 120 is disposed over the substrate 110, while in FIG. 2A, three fin structures 120 are disposed over the substrate 110. However, the number of the fin structures is not limited to one or three. The numbers may be two or four or more. In addition, one or more dummy fin structures may be disposed in contact with both sides of the fin structures 120 to improve pattern fidelity in patterning processes. The width of the fin structure 120 is in a range of about 5 nm to about 40 nm in some embodiments, and may be in a range of about 7 nm to about 12 nm in certain embodiments. The height of the fin structure 120 is in a range of about 100 nm to about 300 nm in some embodiments, and may be in a range of about 50 nm to 100 nm in other embodiments.

In FIG. 2, spaces between the fin structures 120 and/or a space between one fin structure and another element formed over the substrate 110 are filled by an isolation insulating layer (e.g., isolation region 150) including one or more layers of insulating materials. The insulating materials for the isolation region 150 may include one or more layers of silicon oxide, silicon nitride, silicon oxynitride (SiON), SiOCN, fluorine-doped silicate glass (FSG), or a low-k dielectric material.

The lower part of the fin structure 120 under the gate electrode layer 140 is referred to as a well region 120A, and the upper part of the fin structure 120 is referred to as a channel region 120B, as shown in FIG. 2A. Under the gate electrode layer 140, the well region 120A is embedded in the isolation region 150, and the channel region 120B protrudes from the isolation region 150. A lower part of the channel region 120B may also be embedded in the isolation region 150 to a depth of about 1 nm to about 5 nm. Although the upper corners of the fin structures 120 shown in FIG. 2 have right angles, this is only for an illustration purpose, and the shape of the upper corners of the fin structures 120 will be described later.

The channel region 120B protruding from the isolation region 150 is covered by a gate dielectric layer 130, and the gate dielectric layer 130 is further covered by a gate electrode layer 140. Part of the channel region 120B not covered by the gate electrode layer 140 functions as a source and/or drain of the Fin FET device 100 (see, FIG. 1).

In certain embodiments, the gate dielectric layer 130 includes a single layer or alternatively a multi-layer structure, having one or more dielectric materials, such as a single layer of silicon oxide, silicon nitride, or high-k dielectric material, other suitable dielectric material, and/or combinations thereof, or a multilayer of two or more of these materials. Examples of high-k dielectric material include $HfO_2$, HfSiO, HfSiON, HMO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode layer 140 includes one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, one or more work function adjustment layers 160 may be interposed between the gate dielectric layer 130 and the gate electrode layer 140. The work function adjustment layer 160 may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers 160 are made of one or more conductive materials such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer 160 may include a first metal material for the n-channel Fin FET and a second metal material for the p-channel Fin FET. For example, the first metal material for the n-channel Fin FET may include metals having a work function substantially aligned with a work function of the substrate conduction band, or at least substantially aligned with a work function of the conduction band of the channel region 120B. Similarly, for example, the second metal material for the p-channel Fin FET may include metals having a work function substantially aligned with a work function of the substrate valence band, or at least substantially aligned with a work function of the valence band of the channel region 120B. In some embodiments, the work function adjustment layer 160 may alternatively include a polysilicon layer. The work function adjustment layer 160 may be formed by ALD, PVD, CVD, e-beam evaporation, or other suitable process. Further, the work function adjustment layer 160 may be formed separately for the n-channel Fin FET and the p-channel Fin FET which may use different metal layers.

Source and drain regions 125 are also formed in the upper part of the fin structure 120 not covered by the gate electrode layer 140, by appropriately doping impurities in the source and drain regions 125. An alloy of Si or Ge and a metal such as Co, Ni, W, Ti or Ta may be formed on the source and drain regions 125.

In the formation of the isolation region 150, etching operations are performed to recess a top surface 117 of the isolation region 150 to expose part of the fin structures 120. As a result of the etching operation, in particular a wet etching process, a center portion of the top surface 117 between the fin structures 120 appears lower than the edges of the top surface 117, which is adjacent to sidewalls 124 of the fin structures 120, such that the top surface 117 has curved edges 117a with a flat center. The curved edges 117a are residual portions of isolation region 150 because the etching is not ideal, as shown in FIG. 2B. The residual portions of the isolation region 150 inhibit subsequent gate dielectric growth at the curved edges 117a, resulting in a thinner gate oxide at these portions, which impacts the breakdown voltage of the Fin FET device 100 and leads to larger leakage currents across the gate thinned gate dielectric layer 130 at these portions.

Furthermore, the curved edge surface profile of the isolation region 150 may reduce the effective area of the channel region. In addition, the shape of the upper corners of the fin structures may affect the formation of the gate dielectric layer and the device performance. For example, as shown in FIG. 2B, when the fin structure has a sharp corner, such as when the upper edge 123 is substantially perpendicular to the sidewalls 124, the gate dielectric layer 130 at the top corners of the fin structure 120 is thinner than other portions of the gate dielectric layer due to a Si orientation effect. The thinner portions of the gate dielectric layer 130a may induce yield loss from plasma-induced damage.

Figure 8A:
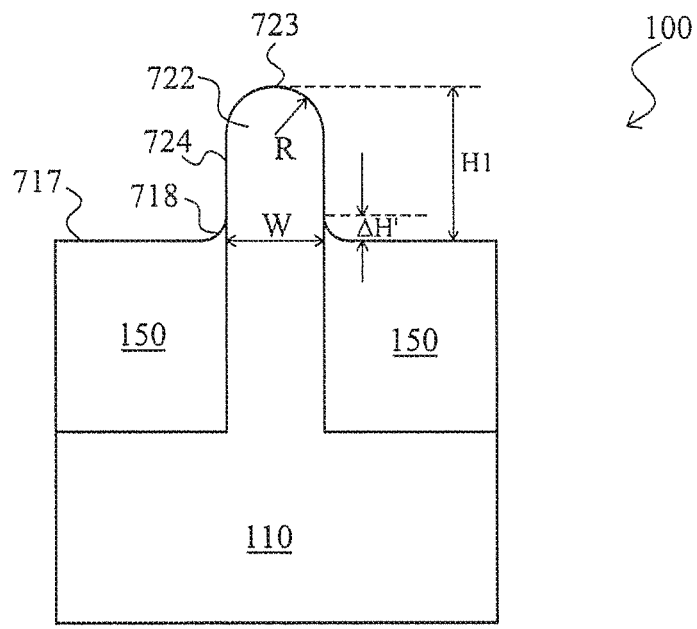

The present disclosure provides a method of fabricating the Fin FET device 100 using a thermal hydrogen treatment operation after the formation of the isolation region 150 in the Fin FET device 100 such that the effects from the curved edge surface profile are decreased thereby improving performance of the Fin FET device 100 (see, FIG. 8A). For example, physical dimensions of edge portions 718 of the top surface 717 of the isolation region 150 can be decreased to minimize the curved edge surface profile. Such minimization of the curved edge surface profile increases an effective area of the channel region and reduces thinning of the gate dielectric layer 130 at the fin structure 100 corners and facilitates gate oxide thickness conformity in the gate dielectric layer 130. In addition, the thermal hydrogen treatment causes the top corners of the fin structure 120 to become substantially rounded (see, FIGS. 8A and 8B), which further facilitates the gate oxide thickness conformity thereby improving the breakdown voltage and minimizing the leakage current in the Fin FET device 100.

Figure 8B:
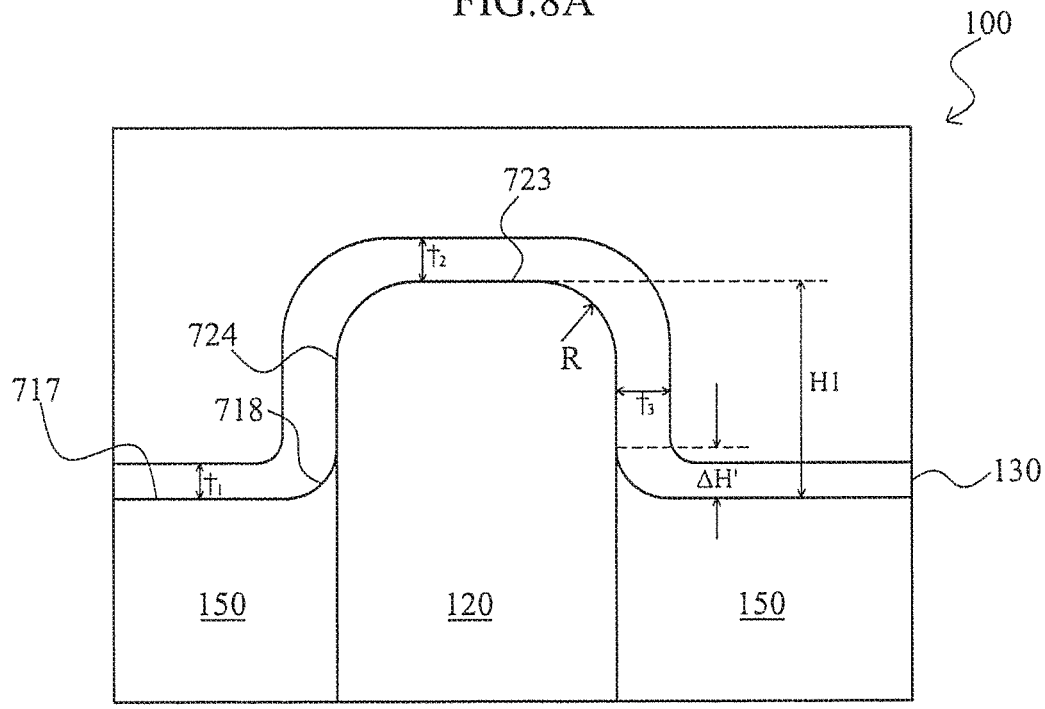
Figure 9:
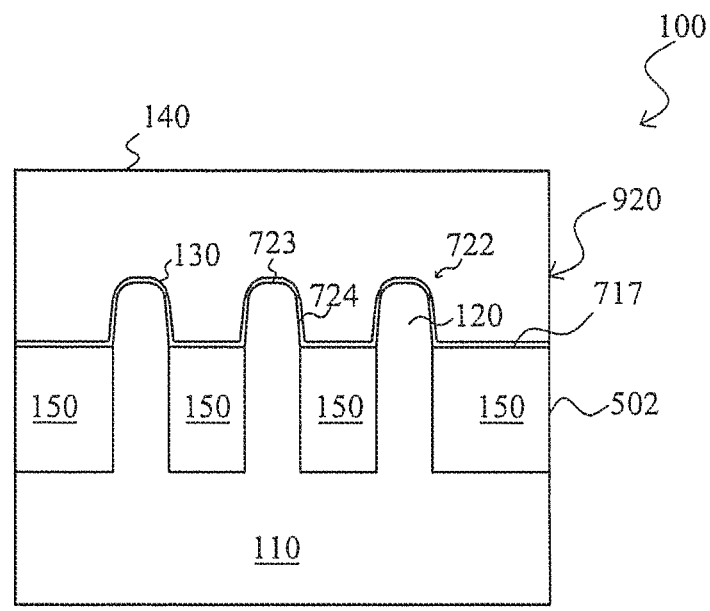
Figure 10:
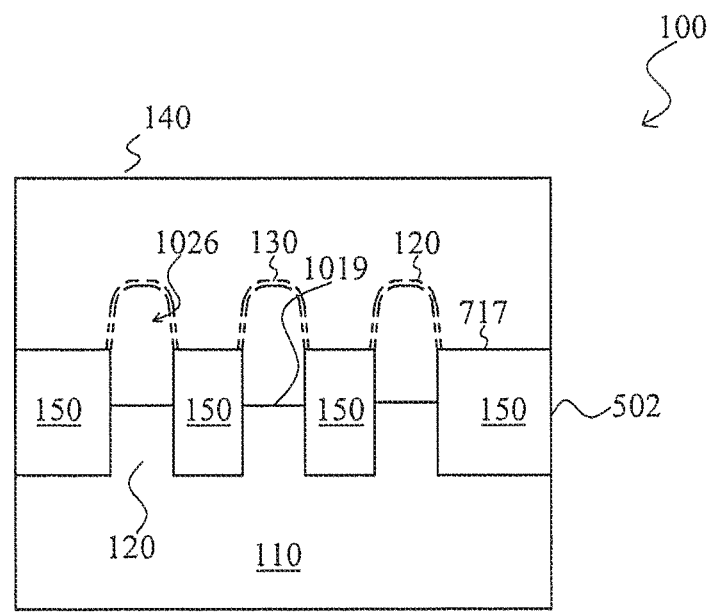
Figure 11:
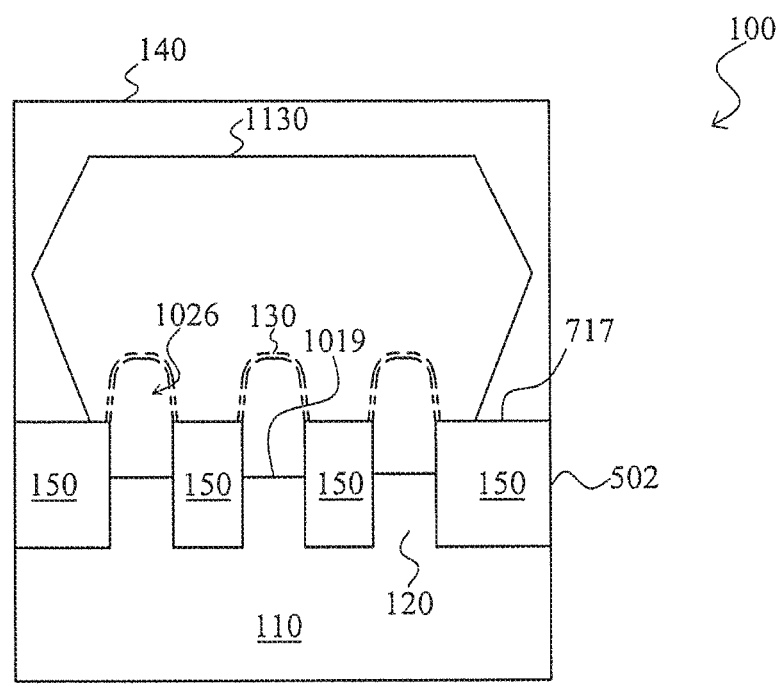

FIGS. 3-11 illustrate examples of cross-sectional views of intermediate stages of a sequential fabrication process of a Fin FET device 100 in accordance with some embodiments of the present disclosure. It is understood that additional operations can be provided before, during, and after operations shown by FIGS. 3-11, and some of the operations described below can be replaced or eliminated, for additional embodiments of the method. The order of the operations may be interchangeable. The cross-sectional views in FIGS. 3-9 are taken under a gate, and the cross-sectional views in FIGS. 10 and 11 are taken at a source/drain region.

Figure 3:
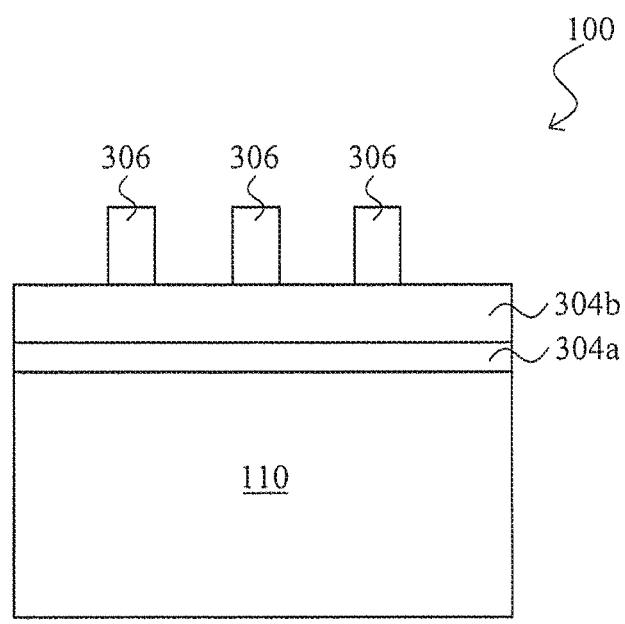
FIGS. 3-11 illustrate examples of cross-sectional views of intermediate stages of a sequential fabrication process of a Fin FET structure in accordance with some embodiments of the present disclosure.

FIG. 3 is a cross-sectional view of the Fin FET device 100 at a stage of fabrication according to an embodiment of the present disclosure. In this embodiment, the Fin FET device 100 includes a substrate 110. In one embodiment, the substrate 110 includes a crystalline silicon substrate (e.g., wafer). A p-type substrate or n-type substrate may be used and the substrate 110 may include various doped regions, depending on design requirements. In some embodiments, the doped regions is doped with p-type or n-type dopants. For example, the doped regions may be doped with p-type dopants, such as boron; n-type dopants, such as phosphorus or arsenic; and/or combinations thereof. The doped regions may be configured for an n-type Fin FET, or alternatively configured for a p-type Fin FET.

In some alternative embodiments, the substrate 110 is made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Also alternatively, the substrate may include an epitaxial layer. For example, the substrate may have an epitaxial layer overlying a bulk semiconductor. Further, the substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the substrate may include an SOI structure. Also alternatively, the substrate may include a buried dielectric layer, such as a buried oxide (BOX) layer, such as that formed by separation by implantation of oxygen (SIMOX) technology, wafer bonding, SEG, or other appropriate process.

In one embodiment, a pad layer 304a and a mask layer 304b are formed on the semiconductor substrate 110. The pad layer 304a may be a thin film having silicon oxide formed, for example, using a thermal oxidation process. The pad layer 304a may act as an adhesion layer between the semiconductor substrate 110 and the mask layer 304b. The pad layer 304a may also act as an etch stop layer for etching the mask layer 304b. In at least one embodiment, the mask layer 304b is formed of silicon nitride, for example, using low-pressure chemical vapor deposition (LPCVD) or plasma enhanced chemical vapor deposition (PECVD). The mask layer 304b is used as a hard mask during subsequent patterning processes. A photoresist layer 306 is formed on the mask layer 304b and is then patterned by a photolithography patterning process. The photoresist layer may be removed after patterning of the mask layer 304b and pad layer 304a and before the trench etching.

Figure 4:
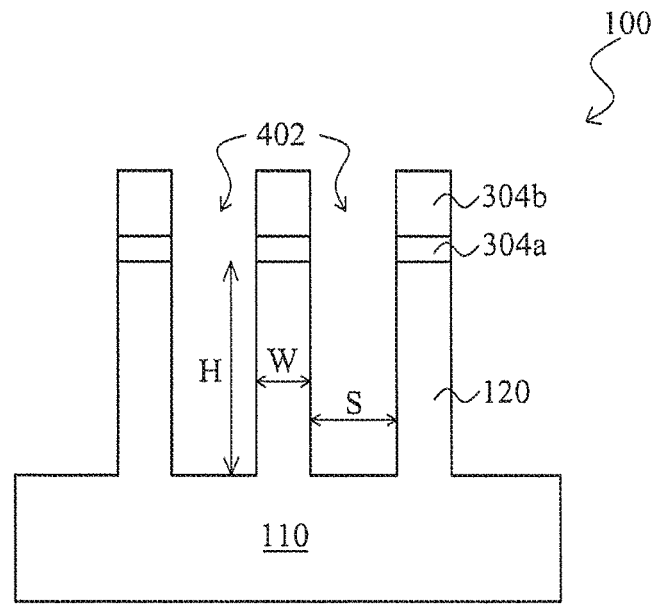

FIG. 4 is a cross-sectional view of the Fin FET device 100 at one stage of the sequential fabrication process according to an embodiment of the present disclosure. The mask layer 304b and pad layer 304a are etched to expose underlying semiconductor substrate 110. The exposed semiconductor substrate 110 is then trench-etched to form trenches 402 by using the patterned mask layer 304b and pad layer 304a as a mask.

In the trench etching process, the substrate 110 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof.

Next, a wet etching operation may be performed to remove a native oxide of the semiconductor substrate 110. The wet etching operation may be performed using dilute hydrofluoric (DHF) acid. Portions of the semiconductor substrate 110 between trenches 402 form semiconductor fins 120. The fins 120 may be arranged in strips (viewed from in the top of the Fin FET device 100) parallel to each other, and closely spaced with respect to each other. Each of the fins 120 has a width W and a height H, and are spaced apart from an adjacent fin by a width S of the trench 402. For example, the width W of the semiconductor fin 120 may be in a range of about 3 nm to about 30 nm in some embodiments.

Figure 5:
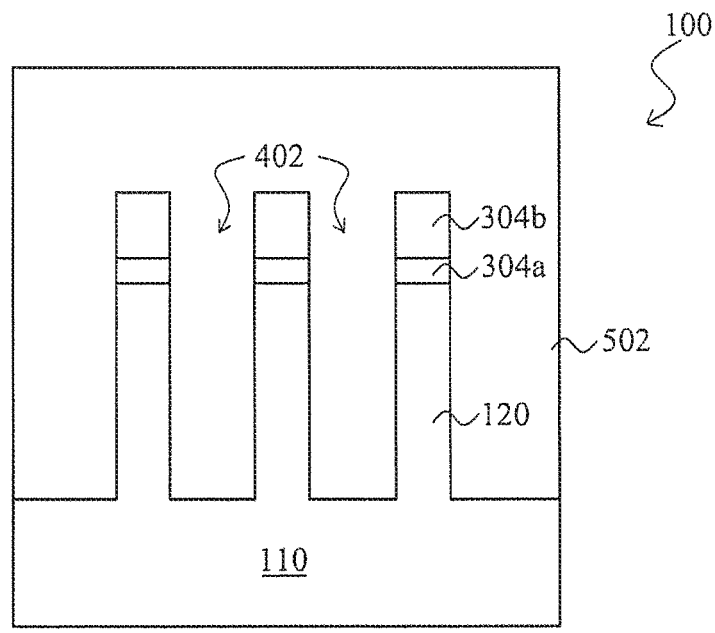

FIG. 5 is a cross-sectional view of the Fin FET device 100 at one stage of the sequential fabrication process according to an embodiment of the present disclosure. Trenches 402 are filled with a dielectric material 502. The dielectric material 502 may include a single layer or a multilayered structure having one or more dielectric materials, such as a single layer of silicon oxide, silicon nitride, or high-k dielectric material, other suitable dielectric material, and/or combinations thereof, or a multilayer of two or more of these materials. In one or more implementations, the dielectric material 502 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired elements to form silicon oxide. When the un-desired elements are removed, the flowable film densities and shrinks. In some embodiments, multiple anneal processes are conducted. The flowable film is cured and annealed.

In some embodiments, other dielectric materials, such as silicon nitride, silicon oxynitride, fluorine-doped silicate glass (FSG), or a low-k dielectric material, are also used to form the dielectric material 502. In an embodiment, the dielectric material 502 is formed using a high-density-plasma (HDP) CVD process, using silane ($SiH_4$) and oxygen ($O_2$) as reacting precursors. In other embodiments, the dielectric material 502 may be formed using a sub-atmospheric CVD (SACVD) process or high aspect-ratio process (HARP), in which process gases may include tetraethylorthosilicate (TEOS) and/or ozone ($O_3$). In yet other embodiments, the dielectric material 502 may be formed using a spin-on-dielectric (SOD) process, such as hydrogen silsesquioxane (HSQ) or methyl silsesquioxane (MSQ). In some embodiments, the filled recess region (or the trenches 402) may have a multi-layer structure such as a thermal oxide liner layer filled with silicon nitride or silicon oxide.

Figure 6:
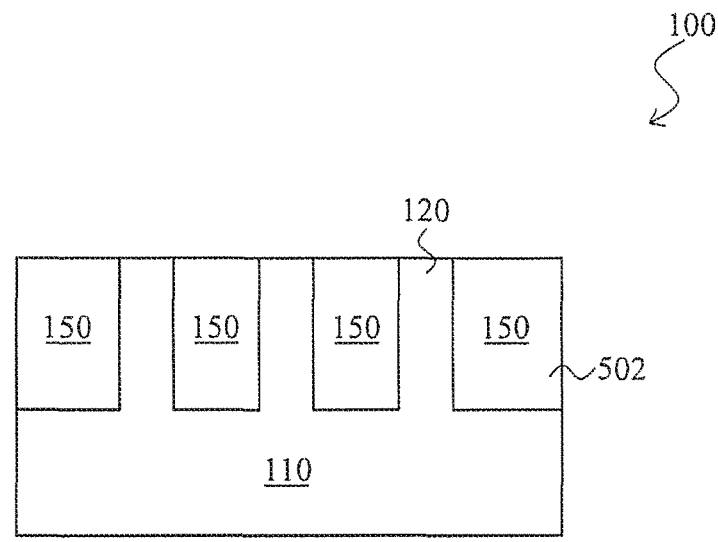

FIG. 6 is a cross-sectional view of the Fin FET device 100 at one of various stages of the sequential fabrication process according to an embodiment of the present disclosure. After the deposition of the dielectric material 502, planarization operations such as a chemical mechanical polish (CMP) and/or an etch-back process are then performed, followed by the removal of the mask layer 304b and pad layer 304a. An annealing process may be performed after the planarization operations. The annealing process includes rapid thermal annealing (RTA), laser annealing processes, or other suitable annealing processes.

In at least one embodiment, the mask layer 304b is formed of silicon nitride such that the mask layer 304b may be removed using a wet process using $H_3PO_4$. The pad layer 304a may be removed using dilute HF acid if the pad layer 304a is formed of silicon oxide. The remaining portions of the dielectric material 502 in the trenches 402 are hereinafter referred to as isolation regions 150. In some embodiments, the removal of the mask layer 304b and the pad layer 304a is performed after the recessing of the isolation regions 150, which recessing operation is shown in FIG. 7.

Figure 7:
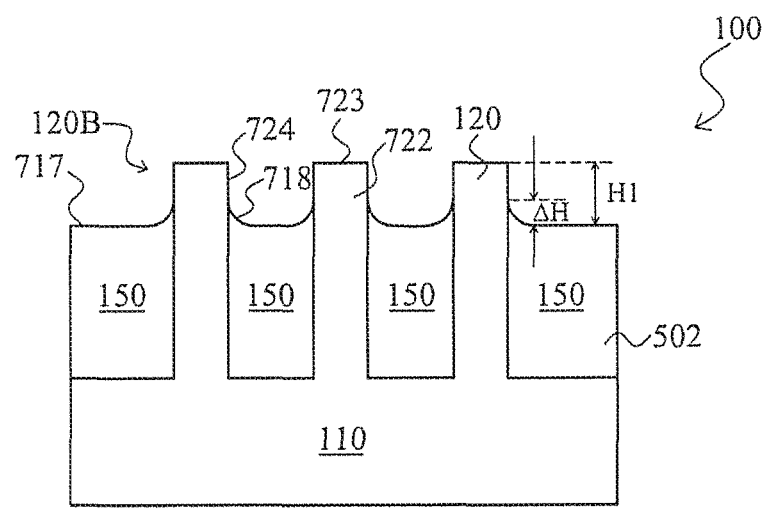

FIG. 7 is a cross-sectional view of the Fin FET device 100 at one stage of the sequential fabrication process according to an embodiment of the present disclosure. An etching process may be performed to etch isolation regions 150 to expose upper portions 722 of the semiconductor fins 120 from the isolation regions 150. The etching process may include a dry etching process, wet etching process, or a combination of dry and wet etching processes to remove portions of the isolation regions 150. It is understood that the etching process may be performed as one etching process or multiple etching processes.

The remaining isolation regions 150 include top surfaces 717. Further, the upper portions 722 of the semiconductor fins 120 protruding over the top surfaces 717 of the remaining isolation regions 150 thus are used to form part of an active area, such as a channel region, of the Fin FET device 100. The upper portions 722 of the semiconductor fins 120 may include top surfaces 723 and sidewalls 724. Height H1 of the upper portions 722 of the semiconductor fins 120, which is to be a channel region, from the top surface 717 of the isolation regions 150 may be in a range of about 6 nm to about 100 nm. In some embodiments, the height H1 is greater than 100 nm or smaller than 6 nm.

As shown in FIG. 7, curved edge surface isolation regions 718 may be present at the top surfaces 717 of the isolation regions 150 sandwiched by two fins 120. In the present disclosure, the curved edge surface isolation structures are defined by curved edges abutting the sidewalls 724 of the channel region 120B with a flat center on the top surface 717. The height $\Delta H$ of the curved edge surface isolation structures 718 are in a range of $0.3H1<\Delta H<0.5H1$ in some embodiments, and in a range of $0.5H1<\Delta H<0.7H1$ in other embodiments.

The curved edge surface isolation regions 718 reduces surface area available in the channel region 120B and causes non-uniform gate dielectric layer at the bottom of the channel region. The decrease in active surface area caused by the curved edge surface isolation structures 718 adversely impacts the collection of channel current flow. The non-uniform oxide thickness caused by the thinning effects also impacts the breakdown voltage of the Fin FET device 100 and induces an increase in leakage current across the gate oxide. The leakage current can be observed near the edges of the top surface 723 of the fins 120, where the thickness of the gate oxide is smaller than that of the sidewalls 724 and/or the top surface 723. In many cases, the variation in thickness across the surface of the channel region 120B can vary by more than 0.6 nm. The thickness of the gate oxide at the edges of the top surfaces 723 of the semiconductor fins 120 becomes relatively smaller due to a Si orientation effect. Such thinning gate oxide may induce yield loss from plasma-induced damage.

In one or more implementations of the present application, a thermal hydrogen treatment is applied to the fin structure and the recessed oxide portion to improve the shape of the fin structure and to substantially eliminate the curved edge surface isolation structures 718 at the interface of the fin structure and the recessed oxide portion.

In this embodiment, the thermal hydrogen treatment is applied with a hydrogen content ambient such as a hydrogen gas ($H_2$). The thermal hydrogen treatment is applied at a gas flow rate in a range of from about 0.2 standard-liter-per-minute (slm) to about 50 slm in some embodiments. The thermal hydrogen treatment is applied at a temperature in a range of from about 700° C. to about 1100° C. in some embodiments, and at a temperature in a range of from about 850° C. to about 1000° C. in other embodiments. The thermal hydrogen treatment is applied at a pressure in a range of about 0.2 Torr to about 760 Torr in some embodiments. The thermal hydrogen treatment may be applied for a duration in a range of about 20 seconds to about 120 seconds in some embodiments. In one or more implementations, the thermal hydrogen treatment is applied for a duration of 80 seconds.

The hydrogen gas may be combined with one or more carrier gases, such as helium, nitrogen, or argon. The concentration of hydrogen in the carrier gas ranges from 2% to 80% based on the total number of moles of hydrogen and carrier gas. In certain embodiments, ammonia ($NH_3$) is used. When $NH_3$ is used, the $NH_3$ can be dissociated into hydrogen and nitrogen at elevated temperatures in accordance with the reaction: $2NH_3 \rightarrow N_2 + 3H_2$.

FIG. 8A is a cross-sectional view of the Fin FET device 100 at one stage of the sequential fabrication process according to an embodiment of the present disclosure. FIG. 8B is a detailed view of a single fin after the gate dielectric layer 130 is formed. After the hydrogen treatment, the curved edge surface isolation structures can be diminished or eliminated in some embodiments, as shown in FIG. 8A and the upper corners of the fin structure can be rounded. For example, the semiconductor fins 120 are adjusted from a first fin surface profile (e.g., square upper edges) to a second fin surface profile (e.g., substantially round upper edges) based on the thermal hydrogen treatment. As shown in FIGS. 8A and 8B, the radius of the curvature R at the corners of the semiconductor fin 120 can be 0.05 W<R<0.5 W in some embodiments, where W is a width of the channel region of the semiconductor fin 120, or 0.1 W<R<0.2 W in other embodiments. The change in height of the curved edge surface isolation structures 718 is in a range of $0.05H1<\Delta H'<0.1H1$ in some embodiments, and in a range of $0.1H1<\Delta H'<0.3H1$ in other embodiments, where H1 is the height of the upper portions 722 of the semiconductor fins 120. In contrast to the upper edges 723 of the fin structure prior to the thermal hydrogen treatment (see, FIG. 7), the fraction of the width and the fraction of the height that is curved after the thermal hydrogen treatment is significantly larger. Conversely, the bottom edges at the interface of the fin structure and recessed oxide portion (see, FIG. 7), the fraction of the height that is curved after the thermal hydrogen treatment is significantly smaller.

The top surface 717 of the isolation region may have a substantially flat step height as a result of the thermal hydrogen treatment. In addition, the top surface 723 of the semiconductor fin 120 may have substantially rounded corners as a result of the applied thermal hydrogen treatment. The substantially flat STI surface provides a larger active surface area of the channel region and the substantially rounded corners of the semiconductor fin 120 provides a uniform thickness gate dielectric 130, thereby improving the breakdown voltage and minimizing the leakage current in the Fin FET device 100.

FIG. 9 is a cross-sectional view of the Fin FET device 100 at one stage of the sequential fabrication process according to an embodiment of the subject technology. A gate stack 920 is formed over the substrate 110 over the top surface 723 and sidewalls 724 of the semiconductor fin 120, and extending to the top surfaces 717 of the first isolation region 150a and the second isolation region 150b. The gate stack 920 includes a gate dielectric layer 130 and a gate electrode layer 140 disposed on the gate dielectric layer 130. During the formation of the gate stack 920, various cleaning/etching processes, which etch the isolation regions 150, may be performed.

The gate dielectric 130 is formed to cover the top surface 723 and sidewalls 724 of at least a portion of the channel region of the semiconductor fins 120. The gate dielectric formed on the upper surface of the isolation region is not shown in FIG. 9 for simplification. Since the upper corners of the fin structures are rounded by the thermal hydrogen treatment, the gate dielectric layer can have a thickness that is substantially uniform over the fin structure (no or reduced thinning effect). The uniformity of the gate dielectric layer 130 is also facilitated by the reduced curved edge surface profile of the isolation regions 150 at the bottom of the channel region (e.g., removed portions of the curved edge surface isolation structures 718).

The gate dielectric layer 130 has a thickness in a range of about 1.8 nanometers (nm) to about 5 nm in some embodiments, and a thickness in a range of about 2.0 nm to about 4.4 nm in other embodiments. The thickness of the gate dielectric layer 130 may be in a range of 3 nm to 5 nm in certain embodiments. In one or more implementations, the gate dielectric layer 130 has a first thickness $t_1$ at the top surface 717 of the isolation region 150, a second thickness $t_2$ at the top surface 723 of the semiconductor fin 120, and a third thickness $t_3$ at one or more sidewalls 724 of the semiconductor fin 120. If the gate dielectric layer 130 was formed on the structure shown in FIG. 7 without performing the thermal hydrogen treatment, the variation in thickness across the surface of the channel region 120B would be more than 0.6 nm. In contrast, by adding the thermal hydrogen treatment, the variations of first thickness $t_1$, the second thickness $t_2$ and the third thickness $t_3$ can be less than 0.3 nm. The variation of the thicknesses at the three identified locations may be less than 0.6 nm in other embodiments. The uniform thickness of the gate dielectric layer 130 can minimize the yield loss from plasma induced damage. Eliminating thinned portions of the gate dielectric layer 130 can reduce the leakage current at the thinned portions of the gate dielectric layer 130.

In some embodiments, the gate dielectric layer 130 includes one or more layers of silicon oxide, silicon nitride, silicon oxy-nitride, or high-k dielectrics. High-k dielectrics may include metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer 130 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 130 may include a single layer or multilayer structure. For example, the gate dielectric layer 130 may further include an interfacial layer (not shown) to reduce damage between the gate dielectric layer 130 and the fin 120. The interfacial layer may include silicon oxide.

The gate electrode layer 140 is then formed on the gate dielectric layer 130. In at least one embodiment, the gate electrode layer 140 covers the upper portion 722 of more than one semiconductor fin 120, so that the resulting Fin FET device 100 includes more than one fin structure. In some alternative embodiments, each of the upper portions 722 of the semiconductor fins 120 may be used to form a separate Fin FET device 100. The gate electrode layer 140 may include a single layer or a multilayer structure. The gate electrode layer 140 may include poly-silicon. Further, the gate electrode layer 140 may be doped poly-silicon with uniform or non-uniform doping. In some alternative embodiments, the gate electrode layer 140 includes a metal such as Al, Cu, W, Ti, Ta, TiN, TiAl, TiAlN, TaN, NiSi, CoSi, other conductive materials with a work function compatible with the substrate material, or combinations thereof. The gate electrode layer 140 may be formed using a suitable process such as ALD, CVD, PVD, plating, or combinations thereof.

FIG. 10 is a cross-sectional view of the Fin FET device 100 at one stage of the sequential fabrication process according to an embodiment of the present disclosure. In this example, the cross-sectional view of the Fin FET device 100 is taken along an axis outside of the gate stack 920.

The portion of the semiconductor fin 120 not covered by the gate electrode layer 140 is recessed to form a recessed portion 1026 of the semiconductor fin 120 having a top surface 1019 below the flat top surfaces 717 of the isolation regions 150. In one embodiment, a biased etching process is performed to recess the top surface 1019 of the channel region that is unprotected or exposed to form the recessed portion 1026 of the semiconductor fin 120. In an embodiment, the etching process may be performed using HBr and/or $Cl_2$ as etch gases.

FIG. 11 is a cross-sectional view of the Fin FET device 100 at one stage of the sequential fabrication process according to an embodiment of the present disclosure. The structures depicted in FIG. 11 are produced by selectively growing a strained material 1130 over the recessed portion 1026 of the semiconductor fin 120 and extending over the top surfaces 717 of the isolation regions 150. Since the lattice constant of the strained material 1130 is different from the channel region of the semiconductor fin 120, the channel region of the semiconductor fin 120 is strained or stressed to enable carrier mobility of the device and enhance the device performance. Although the strained material 1130 overlying each fin is connected in FIG. 11, the strained material 1130 may be formed separately with respect to each fin.

In at least one embodiment, the strained material 1130, such as silicon carbon (SiC) and/or silicon phosphide (SiP), is epitaxially grown by a LPCVD process to form the source and drain regions of an n-type Fin FET. In another embodiment, the strained material 1130, such as silicon germanium (SiGe), is epitaxially grown by a LPCVD process to form the source and drain regions of a p-type Fin FET. The p-type Fin FET and the n-type Fin FET are separately formed. In this regard, an n-type epitaxial region or p-type epitaxial region can be defined using photolithography and etching processes. For example, a protective layer, such as a silicon nitride (SiN) layer, is formed to cover the p-type epitaxial region when the n-type epitaxial region is processed (e.g., S/D formation). Conversely, the SiN layer can cover the n-type epitaxial region when the p-type epitaxial region is processed.

The Fin FET device 100 serves only as one example. The Fin FET device 100 may be used in various applications such as a digital circuit, imaging sensor devices, a heterosemiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The present disclosure provides a method of fabricating a Fin FET device 100 using a thermal hydrogen treatment operation after the formation of the isolation region 150 in the Fin FET device 100 such that the effects from the curved edge surface profile are decreased, thereby improving performance of the Fin FET device 100. For example, physical dimensions of edge portions at the top surface of the isolation region 150 can be decreased to minimize the curved edge surface profile. Such minimization of the curved edge surface profile increases active surface area of the channel region and facilitates gate dielectric thickness conformity at the bottom of the channel region by preventing thinning of the gate dielectric layer 130. In addition, the thermal hydrogen treatment causes the top corners of the fin structure 120 to become substantially rounded, which further facilitates the gate oxide thickness conformity thereby improving the breakdown voltage and minimizing the leakage current in the Fin FET device 100.

In an embodiment, a method of fabricating a Fin FET device is described herein. The method includes providing a substrate having a fin structure, an upper portion of the fin structure having a first fin surface profile. The method also includes forming an isolation region on the substrate and in contact with the fin structure. The method also includes recessing at least a portion of the isolation region by an etch process to form a recessed portion and to expose the upper portion of the fin structure, the recessed portion having a first isolation surface profile. The method also includes applying a thermal hydrogen treatment to the fin structure and the recessed portion. The method further includes forming a gate dielectric layer with a substantially uniform thickness over the fin structure, in which the recessed portion is adjusted from the first isolation surface profile to a second isolation surface profile and the fin structure is adjusted from the first fin surface profile to a second fin surface profile, by the thermal hydrogen treatment.

In another embodiment, a method of fabricating a Fin FET device is described herein. The method includes providing a substrate having fin structures, an upper portion of each of the fin structures having a first fin surface profile. The method also includes forming an isolation region on the substrate such that the fin structures are embedded in the isolation region. The method also includes recessing at least a portion of the isolation region by an etch process to form a recessed portion and to expose upper portions of the fin structures, the recessed portion having a first isolation surface profile between adjacent two fin structures. The method also includes applying a thermal hydrogen treatment to the fin structures and the recessed portion. The method further includes forming a gate dielectric layer with a substantially uniform thickness over the exposed upper portions of fin structures, in which the recessed portion is adjusted from the first isolation surface profile to a second isolation surface profile and the upper portions of the fin structures are adjusted from the first fin surface profile to a second fin surface profile, by the thermal hydrogen treatment.

In yet another embodiment, a semiconductor device includes a substrate and a fin structure having a top surface with substantially rounded corners, the substantially rounded corners being defined by a first radius of curvature relating to a fraction of a width of a channel region in the fin structure which is curved along the top surface and a second radius of curvature relating to a fraction of a height of the channel region which is curved along sidewalls of the fin structure. The semiconductor device also includes an isolation region formed over the substrate and in contact with at least a sidewall of the fin structure, the isolation region having a top surface with a substantially flat step height based on a thermal hydrogen treatment, the substantially flat step height being defined by a downward slope from the sidewalls of the fin structure toward the top surface of the isolation region which relates to a fraction of the height of the channel region. The semiconductor device also includes a gate dielectric layer formed in contact with the fin structure and the top surface of the isolation region, the gate dielectric layer having a thickness that is substantially uniform over the fin structure and the isolation region based on the thermal hydrogen treatment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a fin field-effect transistor (Fin FET) device, the method comprising:

providing a substrate having a fin structure, an upper portion of the fin structure having a first fin surface profile;

forming an isolation region on the substrate and in contact with the fin structure;

recessing at least a portion of the isolation region by an etch process to form a recessed portion and to expose the upper portion of the fin structure, the recessed portion having a first isolation surface profile;

applying a thermal hydrogen treatment consisting essentially of hydrogen gas to the fin structure and the recessed portion; and forming a gate dielectric layer with a substantially uniform thickness over the fin structure,
wherein the thermal hydrogen treatment provides:
the upper portion of the fin structure with a second surface profile, the second surface profile including a top surface of the fin structure having substantially rounded corners being defined by a first radius of curvature relating to a fraction of a width of a channel region in the fin structure which is curved along the top surface and a second radius of curvature relating to a fraction of a height of the channel region which is curved along sidewalls of the fin structure; and
the isolation region with a second surface profile having a substantially flat step height, the substantially flat step height being defined by a downward slope from sidewalls of the fin structure toward a top surface of the isolation region which relates to a fraction of the height of the channel region.

2. The method of claim 1, wherein applying the thermal hydrogen treatment comprises flowing the hydrogen gas with a gas flow rate in a range of 0.2 standard-liter-per-minute (slm) to 50 slm.

3. The method of claim 1, wherein the thermal hydrogen treatment is applied with a temperature in a range of 750 degrees Celsius to 1000 degrees Celsius.

4. The method of claim 1, wherein the thermal hydrogen treatment is applied with a pressure in a range of 0.2 Torr to 760 Torr.

5. The method of claim 1, wherein the thermal hydrogen treatment is applied for a duration in a range of 20 seconds to 120 seconds.

6. The method of claim 1, wherein:
in the forming the gate dielectric layer, the gate dielectric layer is formed to have a first thickness at a top surface of the recessed portion, a second thickness at a top surface of the fin structure, and a third thickness at one or more sidewalls of the fin structure, and
the first thickness, the second thickness and the third thickness vary from one another by less than 0.3 nanometers.

7. The method of claim 1, further comprising:
forming a gate structure over at least a portion of the fin structure and over the isolation region;
forming a second recessed portion by etching a part of the fin structure; and
forming an epitaxial layer in and above the second recessed portion.

8. The method of claim 1, wherein:
the first fin surface profile includes square edges at the upper portion of the fin structure,
the first isolation surface profile includes substantially round edges at an upper portion of the recessed portion, and
the second isolation surface profile includes square edges at the upper portion of the recessed portion.

9. A method of fabricating a fin field-effect transistor (FinFET) device, the method comprising:
providing a substrate having fin structures, an upper portion of each of the fin structures having a first fin surface profile;
forming an isolation region on the substrate such that the fin structures are embedded in the isolation region;
recessing at least a portion of the isolation region by an etch process to form a recessed portion and to expose upper portions of the fin structures, the recessed portion having a first isolation surface profile between adjacent two fin structures;
applying a thermal hydrogen treatment consisting essentially of hydrogen gas to the fin structures and the recessed portion; and
forming a gate dielectric layer with a substantially uniform thickness over the exposed upper portions of fin structures,
wherein the recessed portion is adjusted from the first isolation surface profile to a second isolation surface profile and the upper portions of the fin structures are provided with a second surface profile including a top surface of the fin structure having corners with a radius of curvature R, where $0.1\ W<R<0.2\ W$, where W is a width of a channel region in the fin structure, by the thermal hydrogen treatment.

10. The method of claim 9, wherein:
the first fin surface profile includes square edges at the upper portion of the fin structure,
the first isolation surface profile includes substantially round edges at an upper portion of the recessed portion, and
the second isolation surface profile includes square edges at the upper portion of the recessed portion.

11. The method of claim 10, wherein applying the thermal hydrogen treatment comprises flowing the hydrogen gas with a gas flow rate in a range of 0.2 standard-liter-per-minute (slm) to 50 slm.

12. The method of claim 9, wherein the thermal hydrogen treatment is applied with a temperature in a range of 750 degrees Celsius to 1000 degrees Celsius.

13. The method of claim 9, wherein the thermal hydrogen treatment is applied with a pressure in a range of 0.2 Torr to 760 Torr.

14. The method of claim 9, wherein the thermal hydrogen treatment is applied for a duration in a range of 20 seconds to 120 seconds.

15. The method of claim 9, wherein:
in the forming the gate dielectric layer, the gate dielectric layer is formed to have a first thickness at a top surface of the recessed portion, a second thickness at a top surface of the fin structure, and a third thickness at one or more sidewalls of the fin structure, and
the first thickness, the second thickness and the third thickness vary from one another by less than 0.3 nanometers.

16. The method of claim 9, further comprising:
forming a gate structure over at least a portion of the fin structure and over the isolation region;
forming a second recessed portion by etching a part of the fin structure; and
forming an epitaxial layer in and above the second recessed portion.

17. A semiconductor device, comprising:
a substrate;
a fin structure having a top surface with substantially rounded corners, the substantially rounded corners being defined by a first radius of curvature relating to a fraction of a width of a channel region in the fin structure which is curved along the top surface and a second radius of curvature relating to a fraction of a height of the channel region which is curved along sidewalls of the fin structure;
an isolation region formed over the substrate and in contact with at least a sidewall of the fin structure, the isolation region having a top surface with a substantially flat step height based on a thermal hydrogen treatment, the substantially flat step height being defined by a downward slope from the sidewalls of the fin structure toward the top surface of the isolation region which relates to a fraction of the height of the channel region; and a gate dielectric layer formed in contact with the fin structure and the top surface of the isolation region, the gate dielectric layer having a thickness that is substantially uniform over the fin structure and the isolation region based on the thermal hydrogen treatment.

18. The semiconductor device of claim 17, wherein:

the gate dielectric layer has a first thickness at the top surface of the isolation region, the gate dielectric layer has a second thickness at the top surface of the fin structure, the gate dielectric layer has a third thickness at one or more sidewalls of the fin structure, and the first thickness, the second thickness and the third thickness vary from one another by less than 0.3 nanometers.

19. The semiconductor device of claim 17, further comprising:

a gate stack including a gate electrode layer and the gate dielectric layer, the gate stack covering a portion of the fin structure; and a source and a drain, each including a stressor layer disposed in and over recessed portions formed in the fin structure, the stressor layer applying a stress to a channel region of the fin structure covered by the gate stack.

* * * * *